United States Patent
Weber et al.

(10) Patent No.: US 6,273,589 B1
(45) Date of Patent: Aug. 14, 2001

(54) SOLID STATE ILLUMINATION SOURCE UTILIZING DICHROIC REFLECTORS

(75) Inventors: Andreas G. Weber, Redwood City; Gergory M. Cutler, Cupertino; William R. Trutna, Jr., Atherton, all of CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/239,572

(22) Filed: Jan. 29, 1999

(51) Int. Cl.$^7$ .................................................. F21V 9/00
(52) U.S. Cl. ........................... 362/293; 362/230; 362/231
(58) Field of Search ................................... 362/230, 231, 362/259, 293

(56) References Cited

U.S. PATENT DOCUMENTS

| | | | |
|---|---|---|---|
| 4,754,272 | * | 6/1988 | Illenberg et al. .................. 340/815.1 |
| 5,212,710 | * | 5/1993 | Kaneda et al. ......................... 372/71 |
| 5,803,579 | * | 9/1998 | Turnbull et al. ..................... 362/83.1 |

FOREIGN PATENT DOCUMENTS

406237017 * 8/1994 (JP) ................................ H01L/33/00

* cited by examiner

Primary Examiner—Stephen Husar
Assistant Examiner—John Anthony Ward

(57) ABSTRACT

A light source having emissions in a plurality of spectral bands. The simplest light source according to the present invention is constructed from first and second light sources and a dichroic beam splitter. The first and second solid state light sources emit light in first and second bands of non or only partially-overlapping wavelengths. The dichroic beam splitter combines light from the first and second solid state light sources by passing light in the first band while reflecting light in the second band to generate light having a spectral content in the first and second bands. The solid state light sources are preferably arrays of LEDs, VCSELs, or edge emitting semiconductor lasers. A light source having improved radiance in the green region of the spectrum can be constructed by utilizing first and second solid state light sources that emit in different bands in the green portion of the spectrum. A white light source can be constructed by utilizing a third solid state light source and a second dichroic beam splitter and by choosing the emission bands of the light sources such that light leaving the second dichroic beam splitter is perceived as white by an observer when all three solid state light sources are emitting light. This light source has a radiance that is higher than the radiance of each individual solid state light source.

5 Claims, 2 Drawing Sheets

SOLID STATE ILLUMINATION SOURCE UTILIZING DICHROIC REFLECTORS

FIELD OF THE INVENTION

The present invention relates to light sources, and more particularly, to a solid state light source for use in projectors and the like.

BACKGROUND OF THE INVENTION

Systems for projecting images onto screens are known in the art. Systems based on incandescent or arc lamps are often used in projection displays. However, such sources have limited lifetimes and poor output stability over the life of the light source. In addition, spectral components, such as UV and IR, that are not needed for display purposes must be filtered out of the emissions to avoid damage to other components or the viewer's eyes.

Sources based on combinations of Light Emitting Diodes (LEDs) or semiconductor lasers that emit red, green and blue light can be used as a solid state light source. Since LED and laser emissions are typically spectrally narrow band light sources, the use of color filters for the display can be omitted. Also the optical output of semiconductor lasers and LEDs can typically be electrically modulated at a rate that is sufficient for a time sequential color display. Furthermore most solid state lasers emit linear polarized light which further improves the efficiency of light production and simplifies the optics in projection systems.

Unfortunately, individual solid state light sources do not provide sufficient brightness for many projection display applications; hence, arrays of LEDs must be utilized to obtain sufficient output. However, construction of an array of LEDs with the correct color balance without losing brightness is difficult. In order to provide a full color display the solid state light source has to include emitters of at least three different colors. To maximize the brightness of a color display, the relative area covered by emitters of each color has to be adjusted according to the respective emitter radiance. If all emitters are driven simultaneously, the resulting color shining onto the light modulator used to generate the image must be white. In general, different color emitters will have different output powers per unit area. Hence, to provide maximum brightness, the array must accommodate different individual emitter dimensions. Furthermore the pattern of the individual solid state color emitters has to provide good mixing of the different color emitters in order to maximize the uniformity of illumination at the light valve of each individual color. These constraints are difficult to accommodate in a single two-dimensional source array.

This problem is complicated further by the limitations of present LED technology. Presently, LEDs have higher radiance in the red and blue spectral regions than in the green region of the spectrum. Hence, significantly different emitter areas are needed to provide a balanced output because of the poor radiance of the green detectors.

Broadly, it is the object of the present invention to provide an improved solid state light source for use in projection displays and the like.

It is a further object of the present invention to provide a light source that provides a white light output utilizing LEDs of different radiances.

It is yet another object of the present invention to provide a light source that has a higher radiance than a conventional two-dimensional array of LEDs.

These and other objects of the present invention will become apparent to those skilled in the art from the following detailed description of the invention and the accompanying drawings.

SUMMARY OF THE INVENTION

The present invention is a light source having emissions in a plurality of spectral bands. The simplest light source according to the present invention is constructed from first and second light sources and a dichroic beam splitter. The first and second solid state light sources emit light in first and second bands whose wavelengths do not completely overlap. The dichroic beam splitter combines light from the first and second solid state light sources by passing light in the first band while reflecting light in the second band to generate light having a spectral content in the first and second bands. The solid state light sources are preferably arrays of LEDs or VCSELs. A light source having improved radiance in the green region of the spectrum can be constructed by utilizing first and second solid state light sources that emit in different bands in the green portion of the spectrum. A white light source can be constructed by utilizing a third solid state light source and a second dichroic beam splitter and by choosing the emission bands of the light sources such that light leaving the second dichroic beam splitter is perceived as white by an observer when all three solid state light sources are emitting light.

DETAILED DESCRIPTION OF THE INVENTION

As noted above, one of the main problems with a LED-based light source is the low brightness associated with such sources. This is partially overcome by utilizing arrays of LEDs. To provide a full color display, a solid state light source has to include emitters of at least three different colors. In order to maximize the brightness of a color display, the relative area covered by emitters of each color has to be adjusted according to the respective emitter radiance. If all emitters are driven simultaneously the resulting color shining onto the light modulator has to be white. The fraction of the source area covered by each kind of color emitter is given by:

$$\frac{A_{ci}}{A_{total}} = \frac{P_{ci}}{D_{ci} * \left(\frac{P_{c1}}{D_{c1}} + \frac{P_{c2}}{D_{c2}} + \frac{P_{c3}}{D_{c3}}\right)} \quad (i = 1 \ldots 3) \quad (1)$$

Here, c1, c2, and c3 denote three spectral emitters, $P_{c1}$, $P_{c2}$ and $P_{c3}$ denote the total optical power required for each emitted color c1, c2 and c3, respectively, to generate white light at the display screen. $D_{c1}$, $D_{c2}$ and $D_{c3}$ are the emitted power/area of the individual solid state color emitters that reach the display screen. Finally, $A_{ci}/A_{total}$ (i=1 ... 3) is the fraction of the total source area that is covered by the emitters of one color. Hence, the emitter area that forms a mosaic pattern must accommodate different individual emitter dimensions. Furthermore the pattern of the individual solid state color emitters has to provide good mixing of the different color emitters in order to maximize the uniformity of illumination at the light valve of each individual color. Prior art light sources using a single two-dimensional array of LEDs have had difficulty meeting this goal.

Figure 1:
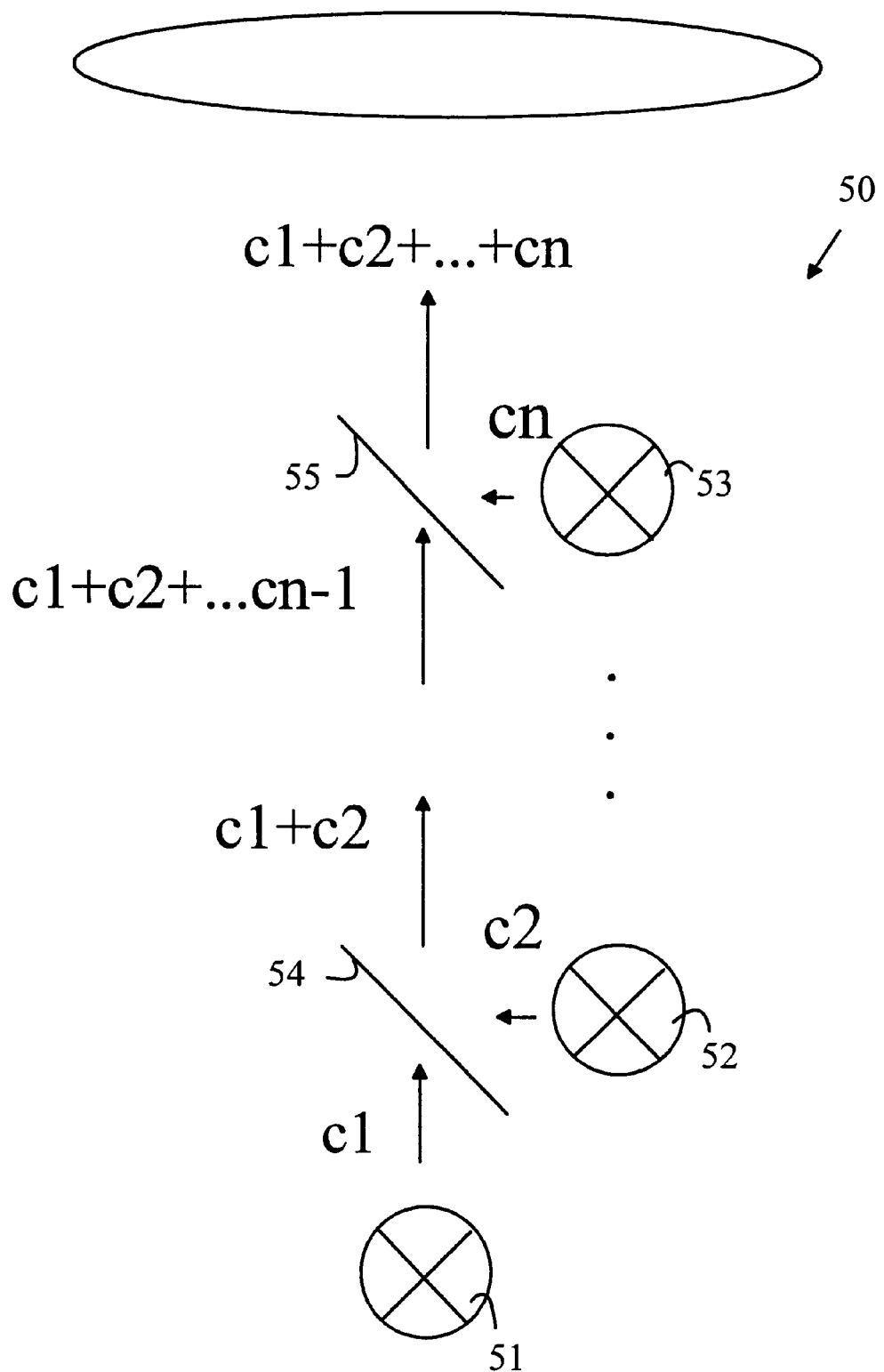
FIG. 1 is a block diagram of a light source according to the present invention.

The present invention overcomes these problems by combining the output of a number of LED arrays using dichroic beam splitters. Refer now to FIG. 1 which illustrates a light source 50 according to the present invention. Instead of mixing the different color emitters that are required by the display onto a single source area mosaic, the emitters of light source 50 are distributed over several source areas each containing emitters of one color. Exemplary arrays of emitters are shown at 51–53. The optical output of each array is combined by the use of beam splitters. Exemplary beam splitters are shown at 54 and 55. Beam splitter 54 combines the output of arrays 51 and 52 which emit light in spectral bands at c1 and c2, respectively. Beam splitter 54 is chosen such that it reflects light around the spectral maximum of array 52 and transmits light of all other visible wavelengths. The light emanating from beam splitter 54 has a higher radiance than each of the individual light source arrays 51 and 52. This process can be repeated with additional arrays of emitters and beam splitters to generate a source with substantially higher radiance and color content around c1, c2, . . . cn than the radiance of a mosaic pattern containing solid state emitters of different colors in one array.

As noted above, green emitting LEDs typically have lower light output than blue LEDs. Hence, the area devoted to green LEDs must be increased. The above described beam splitter arrangement provides a method for increasing the area devoted to green LEDs. If two or more of the sources are constructed from green LEDs having slightly different wavelengths, the effective area of green emitters can be increased.

The degree to which the radiance of a compound source according to the present invention can be increased depends on the width of the emission spectra of the various sources that are combined with the aid of the dichroic beam splitters. Each dichroic beam splitter adds a portion of the output of a source to the combined light beam created by the other dichroic beam splitters in the chain. Each dichoric beam splitter, however, reflects light in a narrow band of wavelengths. If the spectral bands of different sources overlap, a portion of the combined light is lost at each dichroic beam splitter so that light in that narrow band can be introduced into the combined light beam. If the portion lost is less than that gained from the new source, the overall radiance of the source will be increased.

If each source is very narrow, a beam splitter that reflects only at the narrow band of frequencies around the source maximum will add essentially all of the source's output to the combined light output without reflecting much of the light from the sources that were previously combined. Hence, sources with narrow emission spectra are preferred. As noted above, LEDs provide spectra that are much narrower than other light sources such as incandescent lights. In addition, light sources based on semiconductor lasers, both edge emitting and VCSELs can be utilized.

Figure 2:
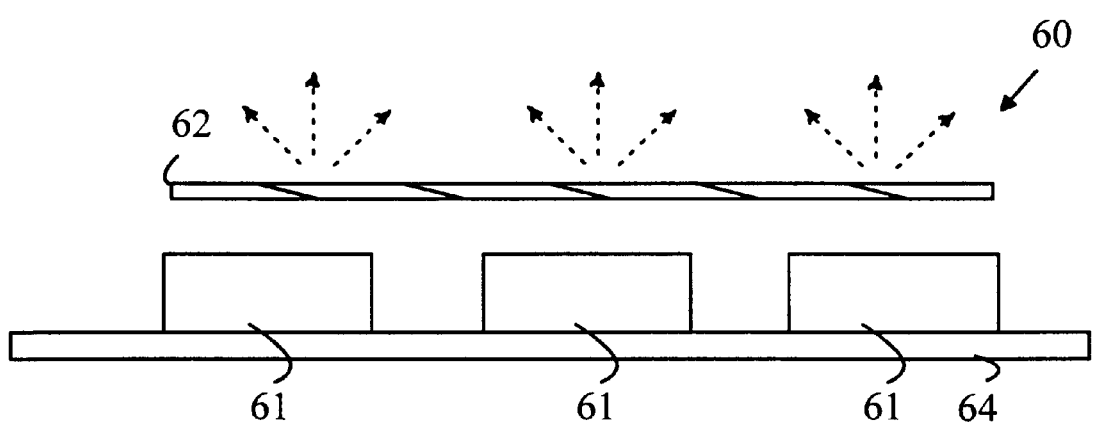
FIG. 2 is a cross-sectional view of a light source for generating green light from an array of blue-emitting LEDs.

This effect can be further enhanced by using highly efficient phosphors or dyes to convert light from a blue emitting LED to other wavelengths. Embodiments of the present invention that provide increased green light output can be constructed by using color conversion. As noted above, current LED technology provides devices with higher radiance in the red and blue spectral regions than for green light. Hence, the radiance in the green region can be improved by using a highly efficient phosphor or dye that is excited with blue light and emits green light. An embodiment of the present invention utilizing such a conversion phosphor is shown in FIG. 2. FIG. 2 is a cross-sectional view of a green light source 60 according to the present invention.

A plurality of blue emitting LEDs shown at 61 are mounted on a reflective heat sink 64. The blue LEDs illuminate a green phosphor layer 62 which converts the blue light to green light. A phosphor such as Strontiumthiogallate ($SrGa_2S_4:Eu^{2+}$) may be utilized for this purpose. Also, a dye such as Coumarine 515 that is utilized in the fabrication of lasers may also be utilized.

Various modifications to the present invention will become apparent to those skilled in the art from the foregoing description and accompanying drawings. Accordingly, the present invention is to be limited solely by the scope of the following claims.

What is claimed is:

1. A light source comprising:

a first solid state light source emitting light in a first band of wavelengths;

a second solid state light source emitting light in a second band of wavelengths different from said first band of wavelengths; and a first dichroic beam splitter for combining light from said first and second solid state light sources, said beam splitter passing light in said first band of wavelengths while reflecting light in said second band of wavelengths, said first dichroic beam splitter combining light from said first and second solid state light sources to generate light having a spectral content in both of said first and second bands and a radiance greater than the radiance of either said first or second solid state light sources, wherein said first solid state light source comprises an array of LEDs, each LED emitting light in said first band of wavelengths, said first band of wavelengths being different from said second band of wavelengths.

2. A light source comprising:

a first solid state light source emitting light in a first band of wavelengths;

a second solid state light source emitting light in a second band of wavelengths different from said first band of wavelengths; and a first dichroic beam splitter for combining light from said first and second solid state light sources, said beam splitter passing light in said first band of wavelengths while reflecting light in said second band of wavelengths, said first dichroic beam splitter combining light from said first and second solid state light sources to generate light having a spectral content in both of said first and second bands and a radiance greater than the radiance of either said first or second solid state light sources, wherein said first solid state light source comprises an array of semiconductor lasers.

3. A light source comprising:

a first solid state light source emitting light in a first band of wavelengths;

a second solid state light source emitting light in a second band of wavelengths different from said first band of wavelengths; and a first dichroic beam splitter for combining light from said first and second solid state light sources, said beam splitter passing light in said first band of wavelengths while reflecting light in said second band of wavelengths, said first dichroic beam splitter combining light from said first and second solid state light sources to generate light having a spectral content in both of said first and second bands and a radiance greater than the radiance of either said first or second solid state light sources, said first band being different from said second band, wherein said first and second solid state light sources comprise arrays of blue emitting LEDs.

4. The light source of claim 3 wherein said first solid state light source comprises a blue emitting solid state light source and a chemical for converting blue light to green light.

5. A light source comprising:

a first solid state light source emitting light in a first band of wavelengths;

a second solid state light source emitting light in a second band of wavelengths different from said first band of wavelengths;

a first dichroic beam splitter for combining light from said first and second solid state light sources, said beam splitter passing light in said first band of wavelengths while reflecting light in said second band of wavelengths, said first dichroic beam splitter combining light from said first and second solid state light sources to generate light having a spectral content in both of said first and second bands and a radiance greater than the radiance of either said first or second solid state light sources;

a third solid state light source emitting light in a third band of wavelengths; and a second dichroic beam splitter, said second dichroic beam splitter reflecting light in said third band while passing light in said first and second bands, said second dichroic beam splitter combining light from said third light source with light from said first dichroic beam splitter, wherein each of said solid state light sources comprises an array of LEDs and wherein the relative areas of said array of LEDs is chosen such that light leaving said second dichroic beam splitter is perceived as white by an observer when all three solid state light sources are on.

* * * * *